United States Patent [19]

Takahashi

[11] Patent Number: 4,837,516
[45] Date of Patent: Jun. 6, 1989

[54] TUNING DEVICE FOR NUCLEAR MAGNETIC RESONANCE IMAGING APPARATUS AND NUCLEAR MAGNETIC RESONANCE IMAGING APPARATUS INCLUDING THE TUNING DEVICE

[75] Inventor: Ryoichi Takahashi, Tochigi, Japan

[73] Assignee: Kabushiki Kaisha Toshiba, Kawasaki, Japan

[21] Appl. No.: 222,904

[22] Filed: Jul. 22, 1988

[30] Foreign Application Priority Data

Jul. 27, 1987 [JP] Japan .................................. 62-185526

[51] Int. Cl.$^4$ ............................................ G01R 33/20
[52] U.S. Cl. .................................... 324/322; 324/318
[58] Field of Search ............................... 324/300–322; 310/323

[56] References Cited

U.S. PATENT DOCUMENTS

| | | | |
|---|---|---|---|
| 3,921,060 | 11/1975 | Ekimovskikh | 324/314 |
| 3,968,426 | 7/1976 | Ward, Jr. | 324/312 |
| 4,642,509 | 2/1987 | Kumada | 310/323 |
| 4,673,882 | 6/1987 | Buford | 324/318 |
| 4,697,117 | 9/1987 | Mishiro | 310/323 |
| 4,703,273 | 10/1987 | Kolbe et al. | 324/309 |
| 4,736,161 | 4/1988 | Prevot et al. | 324/318 |

Primary Examiner—Michael J. Tokar
Attorney, Agent, or Firm—Foley & Lardner, Schwartz, Jeffery, Schwaab, Mack, Blumenthal & Evans

[57] ABSTRACT

A tuning device for an NMR imaging apparatus capable of functioning responsively and accurately in the presence of a strong magnetic field. The device includes LC circuit formed by coils and tuners including variable capacitors, and ultrasonic motors which tunes the LC circuits to a resonant frequency by adjusting the variable capacitors. An NMR imaging apparatus including this tuning device is also disclosed.

10 Claims, 2 Drawing Sheets

TUNING DEVICE FOR NUCLEAR MAGNETIC RESONANCE IMAGING APPARATUS AND NUCLEAR MAGNETIC RESONANCE IMAGING APPARATUS INCLUDING THE TUNING DEVICE

BACKGROUND OF THE INVENTION

1. Field of the Invention

The present invention relates to a nuclear magnetic resonance (NMR) imaging apparatus and, more particularly, to a tuning device for tuning a transmitter coil and/or a receiver coil to a resonant frequency in the NMR imaging apparatus, and an NMR imaging apparatus including the tuning device.

2. Description of the Prior Art

In a conventional NMR imaging apparatus, an object to be examined is placed in a homogeneous and static magnetic field. A sequence of time-dependent magnetic fields, so-called RF pulses, with the frequency equal to the Larmor frequency of specific atomic nuclei to be excited is then applied to this object by an RF transmitter coil. Following this application of the RF pulses, the excited nuclei go through a relaxation process. This process is detected as a NMR signal by a receiver coil. Throughout this excitation and relaxation, various magnetic field gradients are also applied to the object by gradient coils. These magnetic filed gradients enable the examiner to determine the locations of the nuclei upon analysis of the NMR signals. This procedure is repeated with different magnetic field gradients, and the NMR signals thus accumulated are analyzed to obtain information on density distributions and the relaxation times of the nuclei. This information is utilized subsequently to construct tomographic images according to various computational schemes.

In such a NMR imaging apparatus, the RF transmitter coil most commonly is comprised of a pair of saddle-shaped coils. It is usually equipped with a tuner including a variable capacitor, so as to form the resonant LC circuit together for the sake of effective emission of the RF pulses.

The variable capacitor is necessary in order to deal with the different resonant frequencies for different objects to be examined due to the existence of stray capacitance between the RF transmitter coil and the object.

Meanwhile, the RF transmitter coil is required to generate powerful RF pulses in order to induce a sufficient number of NMR excitations. This, in turn, requires very high voltages to be applied to the variable capacitor of the tuner. The variable capacitor therefore needs to be capable of enduring high-voltage conditions.

For this reason, the variable capacitor of the tuner is of the heavy-duty type, and for adjusting the capacitance of this variable capacitor, a powerful adjusting means is required.

Furthermore, this adjusting means has to be capable of functioning in a strong magnetic field. This is because the adjusting means is to be placed in a strong magnetic field along with the tuner. Consequently the usual electric motor cannot be used because it does not operate properly in the presence of a magnetic field.

The adjusting means satisfying these requirements had in the past been either a manually operated type or a permanent magnet motor type having its permanent magnet removed, with the surrounding magnetic field substituting for the role of the permanent magnet.

However, in the former type, the manual operation is tedious, time-consuming and liable to mistakes, while in the latter type, the motor tends to disturb the homogeneity of the magnetic field and generate electric noises.

To cope with these problems, an adjusting means comprising a fluid motor had been proposed by the present inventor, as disclosed in Japanese Patent Laid-Open Specification No. 62-59845.

This fluid motor adjusting means has been able to eliminate the problems of the other adjusting means described above, and it has the added capability of being controlled automatically.

However, the fluid motor adjusting means has a limited precision and a delayed response due to the compressibility of fluids; i.e., a time-lag between the actual operation of the motor and the control signaling for the transmitter tuning exists because of the time required for compressing the fluid, and this makes the precision of the tuning limited.

In addition, the fluid motor generates large acoustic noises when the fluid is a highly compressible medium such as air, and the leakage can occur when the fluid is oil.

SUMMARY OF THE INVENTION

It is therefore an object of the present invention to provide a tuning device for an NMR imaging apparatus, which is capable of functioning responsively and accurately in the presence of a strong magnetic field without disturbing the homogeneity of the magnetic field, and preventing electric noises, acoustic noises or oil leakages.

It is another object of the present invention to provide an NMR imaging apparatus including the tuning device which is capable of functioning responsively and accurately in the presence of a strong magnetic field without disturbing the homogeneity of the magnetic field, and preventing electric noises, acoustic noises or oil leakages.

In accordance with one aspect of the invention, there is provided a tuning device for an NMR imaging apparatus, comprising tuning means including variable capacitor means, coil means for forming resonant LC circuit with the tuning means, and ultrasonic motor means for adjusting the capacitance of the variable capacitor means.

In accordance with another aspect of the invention, there is provided an NMR imaging apparatus comprising a tuning device including tuning means including variable capacitor means, coil means for forming resonant LC circuit with the tuning means, and ultrasonic motor means for adjusting the capacitance of the variable capacitor means; RF amplifier means for generating RF pulses; driver means for driving the ultrasonic motor means; a control means for controlling the RF amplifier means and the driver means; signal processor means for processing NMR signals; display means for displaying tomographic images; magnet means for generating a static magnetic filed; and gradient coil means for generating magnetic filed gradients.

Other features and advantage of the present invention will become apparent from the following description taken in conjunction with the accompanying drawings.

DETAILED DESCRIPTION OF THE PREFERRED EMBODIMENTS

Figure 1:
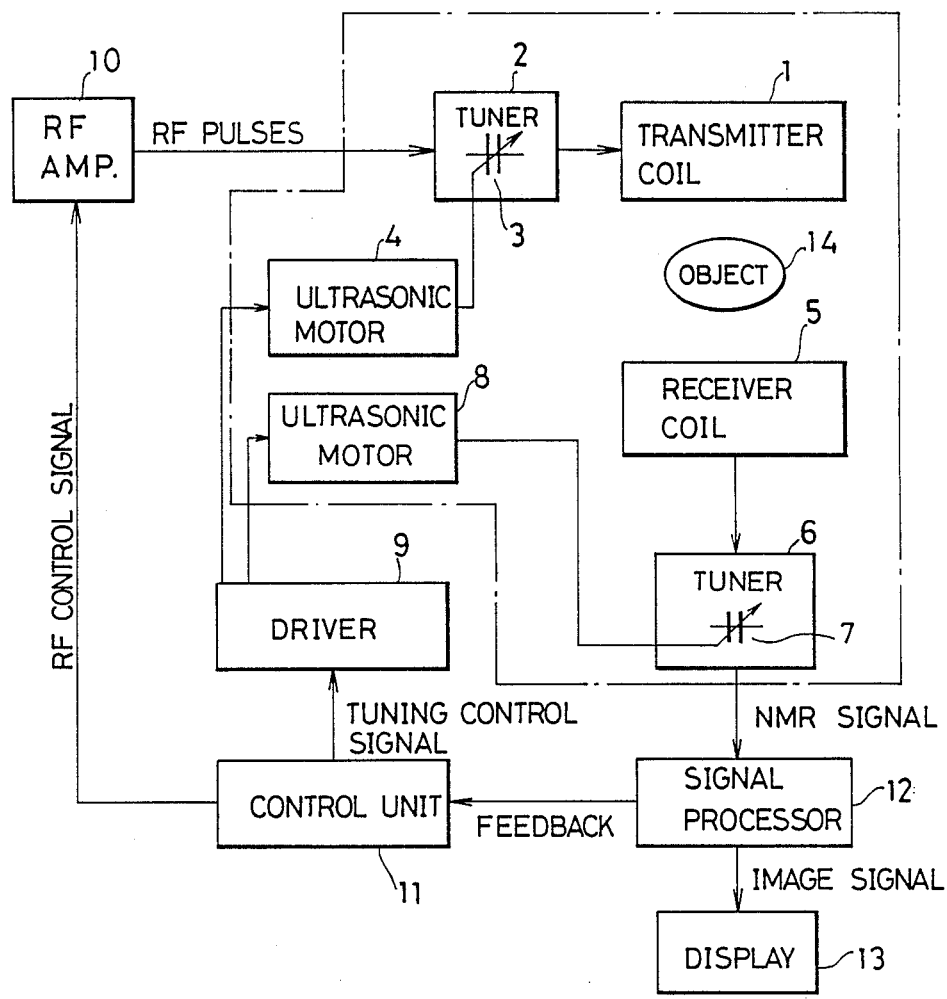
FIG. 1 is a schematic block diagram of an NMR imaging apparatus including one embodiment of a tuning device according to the present invention.
Figure 2:
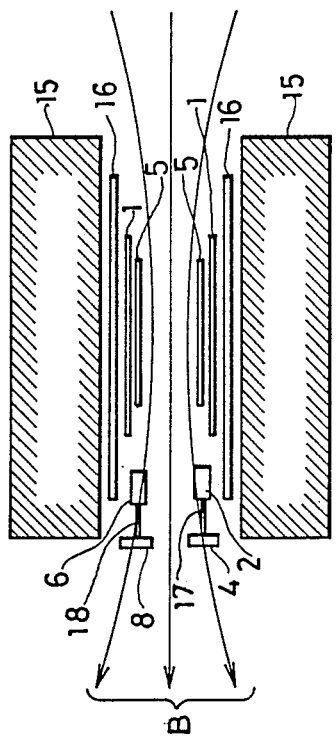
FIG. 2 is a longitudinal sectional view of a static magnetic field region including ultrasonic motor and tuners of the tuning device of FIG. 1.

Referring now to FIGS. 1 and 2, there is shown one embodiment of a tuning device for an NMR imaging apparatus according to the present invention, comprised of a transmitter coil 1 for emitting RF pulses, a tuner 2 including a variable capacitor 3 for forming a resonant circuit with the transmitter coil 1, an ultrasonic motor 4 for adjusting the variable capacitor 3, a receiver coil 5 for detecting NMR signals, a tuner 6 including a variable capacitor 7 for forming a resonant circuit with the receiver coil 5, and an ultrasonic motor 8 for adjusting the variable capacitor 7.

An ultrasonic motor operates by the reaction of a rotor in the clockwise direction against the counterclockwise propagation of surface waves on a deformable portion of a stator, or vice versa. The surface waves on the stator is caused by the ultrasonic vibrations of piezoelectric ceramics attached to the deformable portion. It is fully functional in a magnetic field, highly responsive, almost noiseless, and compact.

This tuning device is utilized in an NMR imaging apparatus further comprising a driver 9 for the ultrasonic motors 4 and 8, a RF amplifier 10 for generating RF pulses, a control unit 11 for controlling the driver 9 and the RF amplifier 10, a signal processor 12 for processing the detected NMR signals, and a display 13 for displaying tomographic images. The object 14 to be examined is surrounded by the transmitter coil 1 and the receiver coil 5. The dashed lines indicates the boundary enclosing a static magnetic region.

FIG. 2 shows the static magnetic region of FIG. 1, in the NMR apparatus shown in FIG. 1, further comprising a magnet 15 with a bore for generating a static magnetic field, and gradient coils 16 for generating magnetic field gradients. The tuner 2 and the ultrasonic motor 4 are connected by an axle 17. The tuner 16 and the ultrasonic motor 8 are connected by an axle 18. Arrows B indicate the direction of the static magnetic field. The transmitter coil 1, the receiver coil 5, and the gradient coils 16 are all placed in the static magnetic field. In addition, it is necessary to align the axles 17 and 18 in the direction B of the static magnetic field. The reason for this will now be explained referring to FIGS. 3, 4 and 5.

Figure 3:
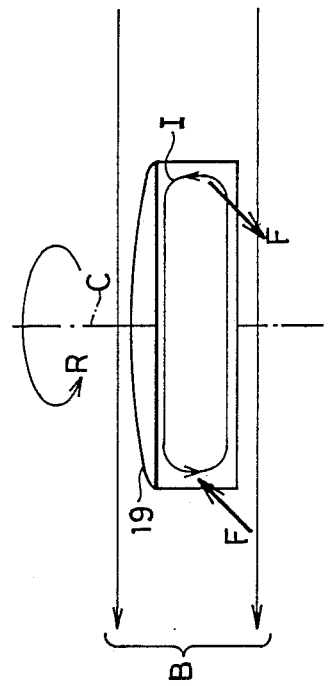
FIGS. 3, 4 and 5 are perspective views of a rotor of an ultrasonic motor for illustrating the appearance of eddy currents and the torque due to eddy currents.
Figure 4:
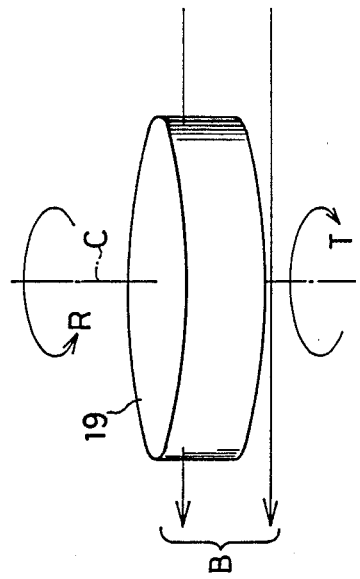
Figure 5:
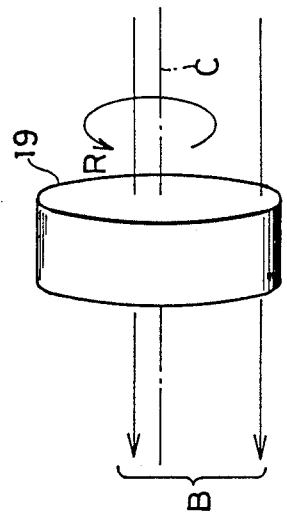

FIGS. 3, 4 and 5 depict a rotor 19 of the ultrasonic motor 4. The letter C represents the axis of rotation of the rotor 19, which coincides with the center of the axle 17 of FIG. 2, while the letter R indicates the direction of the rotation of the rotor 19. As before, arrows B indicate the direction of the static magnetic field.

FIG. 3 shows the case where the axis of rotation C is placed, contrary to the proposed prescription, perpendicular to the direction B of the static magnetic field. Here, the rotation of the rotor 19 in the static magnetic field results in the changing of the magnetic flux density through the cross-sections of the rotor 19. Since the rotor 19 is a conductor, this causes eddy currents I to appear as shown, for example, in the cross-section parallel to the direction B of the static magnetic field where they have maximum magnitude. They also appear in all the cross-sections except for the one perpendicular to the direction B of the static magnetic field, with the sinusoidal variation in their amplitudes between the maximum (the one parallel to B) and the minimum (the one perpendicular to B). These eddy currents I exert forces F on the rotor 19 as shown in FIG. 3, and these forces F in effect give rise to a torque T in the direction opposite to that of the rotation R, as shown in FIG. 4. The torque T will be felt by the rotor 19 as friction, thus affecting the rotational motion of the rotor 19.

On the other hand, FIG. 5 shows the case where the axis of rotation C is placed parallel to the direction B of the static magnetic field. Here, no eddy current develops, for there is no change in the magnetic flux density through any cross-section as the rotor 19 rotates. It is also clear that any configuration in between the two extreme cases described will also develop eddy currents.

Obviously, the same remark applies also to the ultrasonic motor 8. Thus, the care must be taken in arranging the ultrasonic motors 4 and 8 in order to secure optimum operations.

Next the explanation of the operation of this particular embodiment will be given. Referring back to FIG. 1, in this embodiment the RF transmission process is initiated by the control unit 11 which feeds RF control signals to the RF amplifier 10, and tuning control signals to the driver 9. In response, the RF amplifier 10 generates RF pulses and feeds them to the transmitter coil 1 via the tuner 2, while the driver 9 drives the ultrasonic motor 4. The LC circuit formed by the variable capacitor 3 of the tuner 2 and the transmitter coil 1 is tuned to be resonant at the frequency of the RF pulses by the operation of the ultrasonic motor 4 on the variable capacitor 3, so that the emission of RF pulses by the transmitter coil 1 is carried out at optimum efficiency. The responsive and accurate performance of this tuning is possible because of the characteristics of the ultrasonic motor 4 as described above, even through the entire tuning device is in the static magnetic field.

The NMR signals resulting from the application of the RF pulses on the object 14 are detected by the receiver coil 5. Detections are also carried out at optimum efficiency by means of the tuner 6 which tunes the receiver coil 5 to the NMR signals by the operation of the ultrasonic motor 8 on the variable capacitor 6. The detected NMR signals are then fed to the signal processor 12. The signal processor 12 analyzes the NMR signals and constructs tomographic images. The tomographic image data are fed in the form of image signals to the display 13. At the same time, the signal processor also processes the NMR signals in a manner accessible to the control unit 11 and provides feedbacks to the control unit 11. The feedbacks are utilized for the subsequent control operations in order to maintain satisfactory performances.

One can appreciate now that the tuning device according to the present invention is capable of tuning very responsively and accurately in the presence of a strong magnetic field. The device also prevents the undesirable side-effects associated with the prior art, namely, disturbance of the static magnetic field, electric noises, acoustic noises, or oil leakages. It can be seen from the preceding description that these advantages are the direct consequences of the use of the ultrasonic motors 4 and 8 with the particular arrangement described above.

A further advantage of this device comes from the fact that, as described for one embodiment above, it can be controlled automatically so as to perform, very fast, consistent, responsive and accurate tuning operations.

Although the present invention has been described in its preferred embodiment, it is obviously not to be restricted to this preferred embodiment. In particular, equally plausible and satisfactory embodiment can be devised by replacing the tuner 6 and the ultrasonic motor 8 in the above embodiment by a separate tuning unit designed to suit the particularities of the receiver coil 5.

Besides this, many modifications and variations of this embodiment may be made without departing from the novel and advantageous features of this invention. Accordingly, all such modifications and variations are intended to be included within the scope of the appended claims.

What is claimed is:

1. A tuning device for an NMR imaging apparatus, comprising:
    tuning means including variable capacitor means;
    coil means for forming resonant LC circuit with the tuning means; and
    ultrasonic motor means for adjusting the capacitance of the variable capacitor means.

2. The device of claim 1, wherein the coil means includes a transmitter coil for emitting RF pulses and a receiver coil for detecting NMR signals, the tuning means includes a first tuner including a variable capacitor means for forming a resonant LC circuit with the transmitter coil and a second tuner including a variable capacitor means for forming a resonant LC circuit with the receiver coil, and the ultrasonic motor means includes a first ultrasonic motor for adjusting the capacitance of the variable capacitor means of the first tuner for the transmitter coil and a second ultrasonic motor for adjusting the capacitance of the variable capacitor means of the second tuner for the receiver coil.

3. The device of claim 2, wherein each ultrasonic motor includes a rotor and is arranged so that the axis of rotation of the rotor is parallel to the direction of a magnetic field surrounding the ultrasonic motor.

4. The device of claim 1, wherein the coil means includes a transmitter coil for emitting RF pulses, the tuning means includes a tuner including a variable capacitor means for forming a resonant LC circuit with the transmitter coil, and the ultrasonic motor means includes an ultrasonic motor for adjusting the capacitance of the variable capacitor means.

5. The device of claim 4, wherein the ultrasonic motor means includes a rotor and is arranged so that the axis of rotation of the rotor is parallel to the direction of a magnetic field surrounding the ultrasonic motor.

6. An NMR imaging apparatus, comprising:
    a tuning device including tuning means including variable capacitor means, coil means for forming resonant LC circuit with the tuning means, and ultrasonic motor means for adjusting the capacitance of the variable capacitor means;
    RF amplifier means for generating RF pulses;
    driver means for driving the ultrasonic motor means;
    a control means for controlling the RF amplifier means and the driver means;
    signal processor means for processing NMR signals;
    display means for displaying tomographic images;
    magnet means for generating a static magnetic filed; and
    gradient coil means for generating magnetic filed gradients.

7. The apparatus of claim 6, wherein the coil means includes a transmitter coil for emitting RF pulses and a receiver coil for detecting NMR signals, the tuning means includes a first tuner including a variable capacitor means for forming a resonant LC circuit with the transmitter coil and a second tuner including a variable capacitor means for forming a resonant LC circuit with the receiver coil, and the ultrasonic motor means includes a first ultrasonic motor for adjusting the capacitance of the variable capacitor means of the first tuner for the transmitter coil and a second ultrasonic motor for adjusting the capacitance of the variable capacitor means of the second tuner for the receiver coil.

8. The apparatus of claim 7, wherein each ultrasonic motor includes a rotor and is arranged so that the axis of rotation of the rotor is parallel to the direction of a magnetic field surrounding the ultrasonic motor.

9. The apparatus of claim 6, wherein the coil means includes a transmitter coil for emitting RF pulses, the tuning means includes a tuner including a variable capacitor means for forming a resonant LC circuit with the transmitter coil, and the ultrasonic motor means includes an ultrasonic motor for adjusting the capacitance of the variable capacitor means.

10. The apparatus of claim 9, wherein the ultrasonic motor means includes a rotor and is arranged so that the axis of rotation of the rotor is parallel to the direction of a magnetic field surrounding the ultrasonic motor.

* * * * *